(12) United States Patent
Ehlbeck et al.

(10) Patent No.: US 10,283,323 B2
(45) Date of Patent: May 7, 2019

(54) DEVICE, SYSTEM AND METHOD FOR TREATMENT OF AN OBJECT WITH PLASMA

(71) Applicant: Leibniz-Institut für Plasmaforschung und Technologie e.V., Greifswald (DE)

(72) Inventors: Jörg Ehlbeck, Hinrichshagen (DE); Manfred Stieber, Greifswald (DE); Jörg Stachowiak, Greifswald (DE)

(73) Assignee: Leibniz-Institut für Plasmaforschung und Technologie e.V., Greifswald (DE)

( * ) Notice: Subject to any disclaimer, the term of this patent is extended or adjusted under 35 U.S.C. 154(b) by 153 days.

(21) Appl. No.: 15/347,813

(22) Filed: Nov. 10, 2016

(65) Prior Publication Data

US 2017/0133205 A1    May 11, 2017

(51) Int. Cl.
| | |
|---|---|
| A61L 2/14 | (2006.01) |
| H01J 37/32 | (2006.01) |
| A23B 5/015 | (2006.01) |
| A23B 7/015 | (2006.01) |
| B65B 55/04 | (2006.01) |
| H05H 1/24 | (2006.01) |

(52) U.S. Cl.
CPC ........ *H01J 37/32348* (2013.01); *A23B 5/015* (2013.01); *A23B 7/015* (2013.01); *B65B 55/04* (2013.01); *H01J 37/32477* (2013.01); *H01J 37/32568* (2013.01); *H01J 37/32825* (2013.01); *H05H 1/2406* (2013.01); *A23V 2002/00* (2013.01); *H01J 2237/33* (2013.01); *H05H 2001/2412* (2013.01); *H05H 2245/1225* (2013.01)

(58) Field of Classification Search
CPC ................. A61L 2/14; A23B 5/015
See application file for complete search history.

(56) References Cited

U.S. PATENT DOCUMENTS

| 8,961,894 B2 | 2/2015 | Keener |
| 2012/0213664 A1 | 8/2012 | Diver |
| 2013/0230426 A1 | 9/2013 | Popot |

FOREIGN PATENT DOCUMENTS

| DE | 4412902 | 11/1994 |
| DE | 102004049783 | 3/2009 |
| DE | 202008008734 | 11/2009 |
| DE | 102010003284 | 9/2011 |
| DE | 102013107448 | 1/2015 |
| WO | 96038021 | 11/1996 |
| WO | 2009/019156 | 2/2009 |
| WO | 2011/023478 | 3/2011 |
| WO | 2012113568 | 8/2012 |

*Primary Examiner* — Donald R Spamer
(74) *Attorney, Agent, or Firm* — Soroker Agmon Nordman

(57) ABSTRACT

The device for treating an object with plasma comprises a jacket apparatus (10) which forms, or can form, a substantially gas-tight holding chamber (15) in which an object (1) to be treated can be accommodated. The device comprises a first electrode (20) and a second electrode (21), wherein the two electrodes (20, 21) are arranged with reference to the jacket apparatus (10) such that a plasma (2) can be generated in the holding chamber (15) of the jacket apparatus (10). A wall (13) of the jacket apparatus (10) forming the holding chamber (15) of the jacket apparatus (10) has a modulus of elasticity of Ew<10 kN/mm², at least in sections. The device comprises a housing (30), by means of which a housing interior (33) is or can be formed, wherein the jacket apparatus (10) is arranged within the interior of the housing (33).

15 Claims, 3 Drawing Sheets

DEVICE, SYSTEM AND METHOD FOR TREATMENT OF AN OBJECT WITH PLASMA

Figure 1:
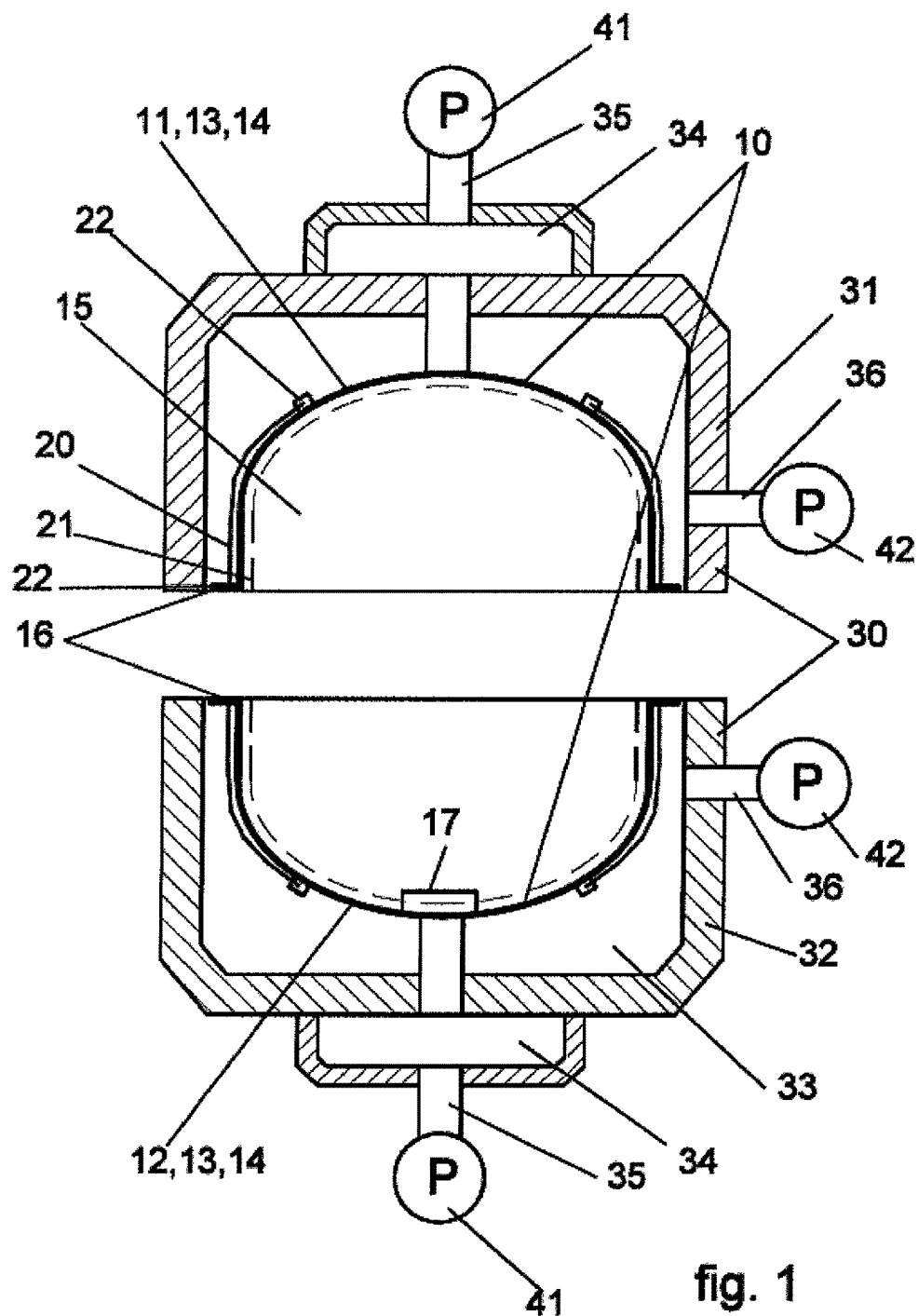

The present invention relates to a device as well as a system and a method for treating an object, in particular one or more free-form objects, with plasma. The object to be treated can in particular be a raw food such as an egg, fruit or vegetable, or packaging as well, or respectively a cap, etc. Treating the object with plasma preferably serves the object of decontaminating and sterilizing the surface of the object.

In particular in the food processing industry, there is a great need for decontamination methods for free-form bodies such as vegetables, fruits and table eggs. Although they have proven to be very safe methods, there is an increasing desire to replace classic chemical methods with alternative methods. Higher germ reduction rates are to be achieved while retaining unchanged the essential properties and nature of raw and processed foods. The application of gas sterilization methods such as the use of formaldehyde or hydrogen peroxide in egg production is problematic and increase the carcinogenicity risk of eggs for hatching.

Plasma-based indirect methods such as ozonization are unsuitable, at least for foods, in view of the impairment of odor and taste that occurs.

Low-pressure reactors generate high investment costs through complex and—especially in the case of batch mode—large receptacles with high dead volumes. The pump rates required at high throughput rates are another cost factor for investment and operation.

WO 2009/019156 A2 describes a method and a number of devices for plasma-supported dry-cleaning, activation, coating, modification and biological decontamination of surfaces by means of an atmospheric pressure plasma generated with dielectric barrier discharge.

Another known apparatus for decontaminating surfaces is so-called plasma patches, or respectively plasma plasters, that are primarily used for medical purposes.

International application WO 2011/023478 A1 that addresses a plasma sleeve discloses an apparatus in which a dielectric barrier surface discharge is generated by a flexible dielectric, a flexible, grounded first electrode, and a flexible second high-voltage electrode. The high-voltage electrode is embedded in the dielectric. Given the flexibility of the dielectric and the electrodes, the overall plasma sleeve is provided with an easily deformable structure that can be adapted correspondingly easily to the contours of the body. In the process of adapting the sleeve to the body's contours and the resulting deformation, the sleeve is, however, continuously subjected to increasing or changing stress so that the embedding of the electrode in the dielectric can become instable during several treatment cycles, which can result in a delamination of the electrode from the dielectric and an associated reduced service life, and accordingly reduced number of cycles for using the plasma sleeve.

The object of the present invention is to provide a device, a system and a method for treating an object with plasma by means of which gentle plasma treatment of objects, in particular three-dimensional free-form bodies, is feasible in an easy, reliable and economical manner, over a long service life of the employed apparatuses.

This object is achieved with the device according to the invention for treating an object with plasma according to claim 1, with the system according to the invention for treating a plurality of objects with plasma according to claim 10, and with the method for treating an object with plasma according to claim 11. Advantageous embodiments of the device according to the invention are specified in dependent claims 2 to 9. Advantageous embodiments of the method according to the invention are specified in dependent claims 12 to 14. The device according to the invention is designed to treat an object with plasma, and comprises a jacket apparatus which forms, or can form, a substantially gas-tight holding chamber in which an object to be treated can be accommodated. Moreover, the device comprises a first electrode and a second electrode, wherein the two electrodes are arranged with reference to the jacket apparatus such that, when an electric difference in potential is applied to the electrodes, a plasma can be generated in the holding chamber of the jacket apparatus. A wall of the jacket apparatus forming the holding chamber of the jacket apparatus has a modulus of elasticity of $Ew<10$ kN/mm$^2$, at least in sections.

Furthermore, the device comprises a housing, by means of which the housing interior is or can be formed, wherein the jacket apparatus is arranged within the interior of the housing. This housing interior can also be designed or can be designable substantially gas-tight.

In a preferred embodiment, all of the material of the jacket apparatus has this low modulus of elasticity, which ensures that the jacket apparatus can be adapted to a three-dimensional shape with minimum exertion of force. This does not prevent the material forming the wall of the jacket apparatus from only having this reduced modulus of elasticity in sections with adjacent sections having a higher modulus of elasticity. However, this embodiment provides that the areas of the jacket apparatus that have this low modulus of elasticity of $Ew<10$ kN/mm$^2$ comprise at least 60% of the area of the jacket apparatus.

Advantageously when only sections of the jacket apparatus are designed with this low modulus of elasticity, at least 80% of the area of the wall, preferably at least 90% of the wall of the jacket apparatus, has this low modulus of elasticity. In particular reinforcements, braces and/or closure elements integrated on or in the jacket apparatus can have a comparably higher modulus of elasticity. The reinforcements, or respectively braces, can be designed from a material that itself has a modulus of elasticity which is greater than 10 kN/mm$^2$. They should, however, preferably have a shape that lends them an overall high elasticity such as a helical spring-shaped or meandering progression.

The material of the jacket apparatus is preferably a polymer. The jacket apparatus itself should be designed gas-tight.

The jacket apparatus which is provided in this manner is flexible enough, at least sectionally, for at least the inside of the jacket apparatus to be able to adapt in a complementary manner to the shape of the object to be treated. In this context, it is possible for the material of the jacket apparatus to not just undergo bending but also pulling, i.e. stretching. The jacket apparatus can accordingly also be advantageously deformed along its length, width and/or height so that an overall surface enlargement or reduction occurs. A reduction of dead volume between the jacket apparatus and the object to be treated can thus be achieved so that plasma can always be generated from the electrodes directly at the surface of the object despite the different shape and/or size of the objects to be treated. Furthermore, by reducing the dead volume, a reduced amount of process gas is needed in the holding chamber. Moreover, specific pressures can be adjusted in the holding chamber as well as the gas flow therein.

The device according to the invention is preferably suitable for different types of discharge, such as dielectric barrier discharge, or discharge by means of high frequency and microwave excitation. Dielectric barrier discharge (DBD) is to be understood as a discharge that occurs between at least two electrodes, of which at least one is insulated by a dielectric. A discharge is generated that locally extinguishes itself very quickly due to the local charging of the dielectric from the current flow of the discharge resulting from the decreasing voltage across the discharge gap. The frequency range that is used lies within the range of the typical mains frequency up to the kHz range. High-frequency discharges (HF discharges) are normally associated with a gas flow, a so-called jet, and use a frequency within the MHz range. Such discharges can occur under atmospheric pressure. Normally, such discharges are used in systems through which gas flows. A microwave discharge typically occurs at a frequency of 2.45 GHz, or respectively 915 MHz, or 9 GHz within the output range of a few watts to several kW.

In a preferred embodiment of the device according to the invention, the jacket apparatus has a first jacket part and a second jacket part, wherein the first jacket part and the second jacket part are connectable to each other gas-tight to form the gas-tight holding chamber. This means that the first jacket part and second jacket part are preferably elements of the jacket apparatus which are arranged and formed symmetrical to the axis, and each individually form a concavity to accommodate a region of the object to be treated. These jacket parts can be disconnected from each other so that the holding chamber for accommodating the object to be treated is exposed, the object can be placed in the holding chamber, and the jacket parts are connected to each other so that the jacket apparatus and holding chamber are closed.

In particular for the embodiment in which the jacket apparatus has a first and second jacket part, it has proven to be advantageous when the housing also has a first housing part and a second housing part, wherein the first housing part is releasably connectable or connected to the second housing part such that the housing interior is designed gas-tight. A pressure gradient across the jacket apparatus can thus be easily generated, wherein a lower pressure predominates in the jacket apparatus, or respectively in the holding chamber, than in the housing interior. Consequently, when the object is arranged in the holding chamber, the inside of the jacket apparatus can adapt to the shape of the object in a complementary manner, at least sectionally. In this context, the pressure in the housing interior can be greater than the normal ambient air pressure.

When the jacket apparatus is designed with the first and second jacket part, it is preferable for the first jacket part to be connected to the first housing part, preferably connected gas tight, and for the second jacket part to be connected to the second housing part, preferably connected gas-tight. With the gas-tight connection of the housing parts to the jacket parts, a gas-tight design of the respective housing interior parts is realized, wherein the respective housing interior part is delimited to the outside by the housing part and delimited to the inside by the respective jacket part. This means that when the jacket element is closed by the gas-tight connection of the jacket parts, the housing is also simultaneously closed by the gas-tight connection of the housing interior parts. However, the invention is not restricted to this design; instead, it can also be designed so that closing can be performed by the jacket element and housing independent of each other.

In both versions, it is, however, possible to insert the object to be treated in one of the segments due to the partition of the device and the resulting two segments so that the object to be treated is accommodated in the holding chamber of the device, and the object can be treated with plasma after the flexible jacket apparatus has adapted to the shape and/or size of the object.

A sealing element that serves to seal between a jacket part and a housing part can, if applicable, simultaneously also carry out the sealing function between the first jacket part and the second jacket part. The employed sealing element is preferably designed such that pressure can be generated on the sealing element by overpressure outside of the holding chamber relative to the pressure in the holding chamber so that the sealing element is sealed gas-tight. In particular, the sealing element can be realized by a sealing bead on the respective jacket part that is sealingly connectable to a correspondingly designed sealing bead on the opposing jacket part.

In addition to the elastic deformation of the jacket element for adapting to the three-dimensional shape of the object to be treated, plastic deformations of the jacket element are, however, also not excluded such that a combination of elastic and plastic deformation may also occur. The thickness of the wall of the jacket element is preferably a maximum one-tenth of the maximum extension of the unstressed jacket apparatus.

The first and/or second electrode can be fastened with respect to the jacket apparatus, and preferably on the jacket apparatus, by means of fastening means, wherein the distance between at least one pair of adjacent fastening means serving to fasten an electrode corresponds to at least one-third of the length of the section of this electrode that runs substantially parallel to the outer surface of the jacket apparatus. This ensures that the electrode material lies against the material of the jacket apparatus in a mechanically decoupled and elastically deformable manner, and is however fastened to the jacket apparatus at only a few points. In the deformation of the jacket apparatus, this causes the respective electrode to be substantially entrained when the jacket apparatus moves to adapt to the shape and size of the object; however, it is not necessarily subject to such strong changes in shape as the jacket apparatus itself. Rising or alternating loads that occur in the deformation of the jacket apparatus are accordingly not completely transmitted to the electrodes, so that they are subject to less stress and have a longer service life. Advantageously, the distance between at least one pair of adjacent fastening means serving to fasten an electrode is at least one-half the length of the section of this electrode that runs substantially parallel to the outer surface of the jacket apparatus. This parallel-running section is the region of the electrode that forms the plasma with the other electrode that treats the object. Parallelism exists when the jacket apparatus is in a relaxed, initial state in which it, or its individual segments, form a maximum volume of the holding chamber.

Because one or both electrodes are connected relatively loosely to the jacket apparatus, the electrodes are entrained sufficiently by the jacket apparatus as it deforms when the material of the jacket apparatus deforms so that they lie tightly enough against the object arranged in the holding chamber for the plasma generated between the electrodes to act on the object. The electrode material preferably does not cover 100% of the surface of the jacket apparatus, but is arranged in a structure on the surface of the jacket apparatus, such as in the form of strips.

In another possible embodiment, the first electrode and/or the second electrode is/are fastened with respect to the jacket apparatus by means of fastening means, wherein when an electrode is fastened to the outer side of the jacket apparatus, i.e., within the housing interior, the fastening means of this electrode are arranged on the housing and/or on a fluidic connection running through the housing.

Alternatively or in addition, when an electrode is fastened to the inner side of the jacket apparatus, i.e., in the holding chamber, the fastening means for this electrode are designed with a mechanical connection of a fluidic connection running through the housing.

It is furthermore possible for the first electrode and/or the second electrode to be designed in liquid form in order to optimally adapt to the shape of the jacket apparatus so that homogeneous adaptation to the object to be treated is always feasible in the event of elastic deformations of the jacket apparatus, or respectively the dielectric.

This means that an electrode part can be designed in liquid form within the housing interior, or also in the holding chamber, or respectively the dielectric. Given the structural arrangement of the electrode material, the electrodes do not have to perform any changes in the size of the surface of the jacket apparatus, only bending, stretching or shrinking movements.

A liquid with a certain conductivity such as water, or water with added salts, in the housing interior can be used directly as a full-fledged, flexible electrode. Given the direct contact with the dielectric, parasitic discharges can be avoided, and manifestations of fatigue in the liquid electrode from load changes cannot occur. The possibilities for cooling or respectively temperature control also exist.

Preferably, the liquid is accommodated in one or more containers that also manifest low flexural rigidity and are preferably formed, at least on one side, by the jacket apparatus.

Any changes in volume that occur in the interior of the housing filled with the liquid electrode caused by the adaptation of the flexible dielectric to the object to be treated can be accomplished by means of a reservoir, pressure compensation vessel, or an overflow.

The fastening means serving to fasten the electrodes can be realized by molded, adhered and/or interwoven sections. Alternatively, due to elastically inherent stress, at least one electrode is arranged on the material of the jacket element so that, when the jacket element deforms, the electrode follows the jacket element due to its elastic restoration force and accordingly also adapts to the shape of the object to be treated.

Adjacent fastening means serving to fasten an electrode can also be outside the section that runs parallel to the wall of the jacket apparatus, such as fastening means that are arranged on the ends of the respective electrode to be fastened therewith. In this embodiment, the pressure gradient used to adapt the jacket apparatus to the size and/or shape of the object to be treated is accordingly also used to adapt the electrode to the shape and/or size of the object to be treated. Because the electrodes can be flexibly adaptable to the shape, or respectively size, of the object to be treated, minuscule distances between the electrodes and the object to be treated can be realized so that, in addition, only small voltages are needed to generate the required plasma. Correspondingly, less effort needs to be pursued with regard to the insulation, construction volume and operating safety at a lower voltage. An electrode can furthermore be connected to the material of the jacket apparatus by spring force, gravity or a form fit, and be thereby entrained when the jacket apparatus moves. In realizing a form fit, the material of the jacket apparatus that preferably also represents the dielectric is formed with corresponding grooves, bumps or pockets. Nevertheless, in a preferred embodiment of the device according to the invention, the first electrode is to be designed as a high-voltage electrode, and the second electrode is to be designed as a grounded electrode.

In a preferred embodiment, the first electrode and second electrode are insulated by a dielectric and configured to realize a dielectric barrier discharge to generate plasma. The dielectric is preferably the material, or respectively the wall, of the jacket apparatus. In particular, the jacket material can be an elastic polymer or can mainly have such a polymer. In an alternative embodiment, the dielectric needed for the dielectric barrier discharge can be formed by the treated material itself. Here, the object to be treated is itself an independent electrode, or respectively an independent potential. In addition, the object to be treated can also be connected to one of the potentials by means of a contact. An electrode realized in the dielectric can be realized in this dielectric in liquid form in channels. Alternatively or in addition, a flexible electrode, such as consisting of spring steel, can be used in the housing interior. To prevent parasitic discharge, the housing interior should, however, then be filled with a substance that ensures a dielectric strength for the discharge path in the housing interior that is higher than that of a process gas in the holding chamber. Such a substance can be highly insulating liquids such as silicone and oils, as well as gases such as SF6. Heat can be removed from the reaction chamber, or the temperature thereof can be controlled, respectively, by the flow of this insulating medium. This embodiment should contain an apparatus by means of which this medium can be circulated to cool the system or to adjust a specific process temperature.

The jacket apparatus has at least one spacing element on its inside that faces the holding chamber, by means of which the object to be treated can be positioned at a distance from the inside of the jacket apparatus to precisely position the object to be treated, for the plasma to form a corona, and to prevent the composition of the process gas in the holding chamber from being negatively influenced by outgassing from the object. The holding element is provided to maintain a distance of, for example, 1-3 mm between the inside of the jacket apparatus and the object, wherein the spacing element can be formed by a groove, rib or bump. Such grooves, ribs or bumps can run tangentially on the inner surface of the jacket apparatus.

In addition, gas channels, or respectively oblique grooves, can be arranged on the inside of the jacket apparatus and run between the jacket apparatus and the object to be treated and generate a tangential process gas flow along the object, and/or center the object in the jacket apparatus. By increasing the flow speed of the process gas in these gas channels, an elevation of the object from the spacing element, or from a base plate that may be arranged instead of the spacing element, can be achieved to also enable treatment of the bottom region of the object.

The device can furthermore be designed so that the jacket apparatus, in a closed state, substantially has the shape of a sphere or ellipsoid, wherein the jacket apparatus has a plurality of folds that create radial notches in the shape of the sphere, or respectively ellipsoid, wherein the respective directions of longitudinal extension of the notches are arranged substantially parallel to each other. This creates a jacket apparatus structure similar to a lemon squeezer. The folds can run from the first intersection of an imaginary rotational axis with the surface of the jacket apparatus to the second, opposite intersection of an imaginary rotational axis with the surface of the jacket apparatus. Not just the inwardly directed folds form; but folds also form that are arranged to alternate with the inwardly directed folds and face away from the object to be treated. Electrodes running on the outside of the jacket apparatus are preferably positioned on the folds that face the treatment chamber and hence also face the object to be treated. Electrodes running on the inside of the jacket apparatus are preferably positioned on or in the folds that face away from the treatment chamber and hence also face away from the object to be treated.

In another advantageous embodiment of the device according to the invention, the invention has an apparatus for generating a volumetric flow of gas into the holding chamber and/or out of the holding chamber. The device is accordingly designed to draw a fluid out of the chamber, and/or let it flow into the holding chamber, wherein the fluid is in particular a process gas, or respectively a process gas mixture. The goal of this apparatus is to conduct the process gas mixture under a slight overpressure into the free space between the inside of the jacket apparatus and the surface of the object to be treated in order to produce a plasma with the desired intensity or quality for treating the object.

Furthermore, the device according to the invention preferably comprises an apparatus for generating a pressure gradient between the holding chamber forming the jacket apparatus and the surroundings of the jacket apparatus. In particular, an overpressure can thus be formed within a housing interior that is formed from the inside of the housing and the outside of the jacket apparatus so that pressure can be created within said housing interior that is greater than the pressure in the holding chamber so that the easily deformable jacket apparatus can adapt to the shape and/or size of the object to be treated.

The apparatus for generating a pressure gradient can have substantially the same aggregates, or respectively be formed from the same aggregates, as the apparatus for generating a volumetric flow of gas.

The housing can have a first fluidic connection that connects the housing interior to the surroundings of the housing, and to which, in particular, an apparatus for generating overpressure such as a pump is connected. Alternatively or in addition, the device has a second fluidic connection that connects the holding chamber to the surroundings of the housing, and in particular to an apparatus for generating an underpressure, wherein this apparatus for generating underpressure can also be a pump. An overpressure can thus be generated in the housing interior and/or an underpressure in the holding chamber so that the jacket apparatus is pulled, or respectively pushed against the object to be treated due to the predominating pressure conditions, and the electrodes arranged in the proximity of the jacket apparatus can generate the plasma necessary to treat the object. For flushing the holding chamber, e.g. to remove toxic gases forming in the process, the gas flow as well as the pressurized areas can be reversed. Standing toxic gases can accordingly be drawn off without being overly diluted. This facilitates disposal.

Preferably, the device according to the invention is designed with an electrode created from a fluid in combination with a solid, flexible electrode such as spring steel insulated by a flexible dielectric.

The advantage of a fluid electrode is that electrode cooling can be easily ensured by a flow of fluid. Gas flows and/or the operating pressure can be adjusted by fluidic connections and/or corresponding adjustments of the apparatus for generating a volumetric flow of gas, or respectively adjustments of the apparatus for generating a pressure gradient. The free selection of the process gas mixture as well as the reduction of the operating pressure make it possible to operate the dielectric barrier discharge with moderate voltages. Given the minimization of the dead volume, a reduction of the pump performance for supplying and removing the gas is evident. In addition to the reduced amounts of needed gas, this also leads to a reduction of costs with regard to the evacuation process, and to a minimization of processing times. When the device is used at a low to medium pressure, a plurality of process gases can be used such as air, noble gases and forming gases.

Furthermore, a system is provided according to the invention for treating a plurality of objects with plasma that comprises a plurality of devices according to the invention for treating an object with plasma, wherein these devices are mechanically connected to each other such that movements of the respective first and second jacket parts can be performed by them to close and/or open the holding chambers provided by these jacket parts. The individual devices are combined in the system into corresponding multiple models or palettes.

Furthermore, the system is advantageously designed when the first housing parts and second housing parts of the individual devices can be moved together, and when a common apparatus exists to generate a volumetric flow of gas and/or a common apparatus exists to generate a pressure gradient by means of which the devices incorporated in the system can be jointly filled with a process gas, or respectively the process gas can be ventilated therefrom, or respectively by means of which a pressure gradient can be generated jointly across the holding chambers of the devices incorporated in the system. The system according to the invention has the advantage of being expandable as desired, as well as increased process reliability in the event that an individual module fails.

Another aspect of the device according to the invention is a method for treating an object with plasma by means of a device according to the invention, or a method as well for treating a plurality of objects with plasma by means of the system according to the invention. An object to be treated with plasma is accommodated in the holding chamber formed by the jacket apparatus, the holding chamber is sealed substantially gas-tight, and the shape and/or size of the holding chamber is substantially adapted to the shape and/or size of the object to be treated. By applying an electrical difference in potential to the electrodes, a plasma is generated in the holding chamber of the jacket apparatus that acts on the object to be treated. Preferably, the holding chamber is sealed completely gas-tight. The shape and/or size of the holding chamber is also preferably completely adapted to the shape and/or size of the object to be treated. Preferably, a dielectric barrier discharge is generated that is operated with moderate voltages, wherein a HF-excited plasma source can be used, or an MW-excited plasma source as well. The device according to the invention, or respectively the system according to the invention, can be used as the basis of a modular in-line method for the plasma treatment of free-form bodies.

In a preferred embodiment of the method according to the invention, a pressure gradient is generated over the jacket apparatus to adapt the shape and/or size of the holding chamber to the shape and/or size of the object to be treated so that, given the elasticity of the jacket apparatus, it adapts at least sectionally to the shape and/or size of the object to be treated. That is, by means of a pressure gradient, or respectively a pressure drop, an adaptation of the inside of the jacket apparatus to the shape of the object to be treated is realized. An absolute pressure of 200 mbar-3 000 mbar can for example predominate in the housing interior. A differential pressure between the housing interior and the holding chamber of 0 mbar-2 800 mbar can be adjusted. The greater the pressure gradient between the housing interior and holding chamber, the lower the pressure voltages required to generate the plasma depicted inter alia by the so-called Paschen curve due to the geometric adaptation of the jacket apparatus to the material to be treated. Once the jacket apparatus has adapted to the shape and size of the object to be treated due to the pressure gradient, a preferably independent sealing function occurs that is primarily supported by the elasticity of the polymer used as the material of the jacket apparatus.

A process gas that is needed in the holding chamber can be introduced at the same time or afterward into the working chamber while maintaining the desired pressure conditions.

After treating the object with plasma, the used process gas mixture is withdrawn from the working chamber. The process gas mixture can in particular be air, or a mixture of air and argon as well, or a mixture of air, argon and oxygen in conjunction with NO, or respectively $NO_2$ and $H_2O$.

In realizing the method according to the invention by using the system according to the invention, a plurality of objects are treated simultaneously with plasma. This simultaneous plasma treatment is carried out by simultaneously using the devices according to the invention.

In particular, a reduction of shell germs of table eggs and eggs for hatching is achievable with the method according to the invention, wherein a pressure is set in the holding chamber that corresponds to the normal atmospheric pressure.

In addition, a use is provided according to the invention of the device according to the invention for treating an object with plasma, wherein the device is used for decontaminating, disinfecting, sterilizing, cleaning, activating and/or coating objects that are realized as free formed objects. In particular, the device can be used for disinfecting, sterilizing and/or cleaning foods such as fruit or vegetables or eggs, or respectively packages such as bottles and boxes. Sterile packaging can immediately follow the completion of the respective decontamination, or respectively sterilization or cleaning process.

A major advantage of the device according to the invention is that it disinfects and sterilizes itself while it is operating and plasma is being generated so that no extra cleaning steps are needed between individual treatment processes.

The invention will be explained below with reference to the exemplary embodiments depicted in the accompanying drawings.

In the figures

Figure 2:
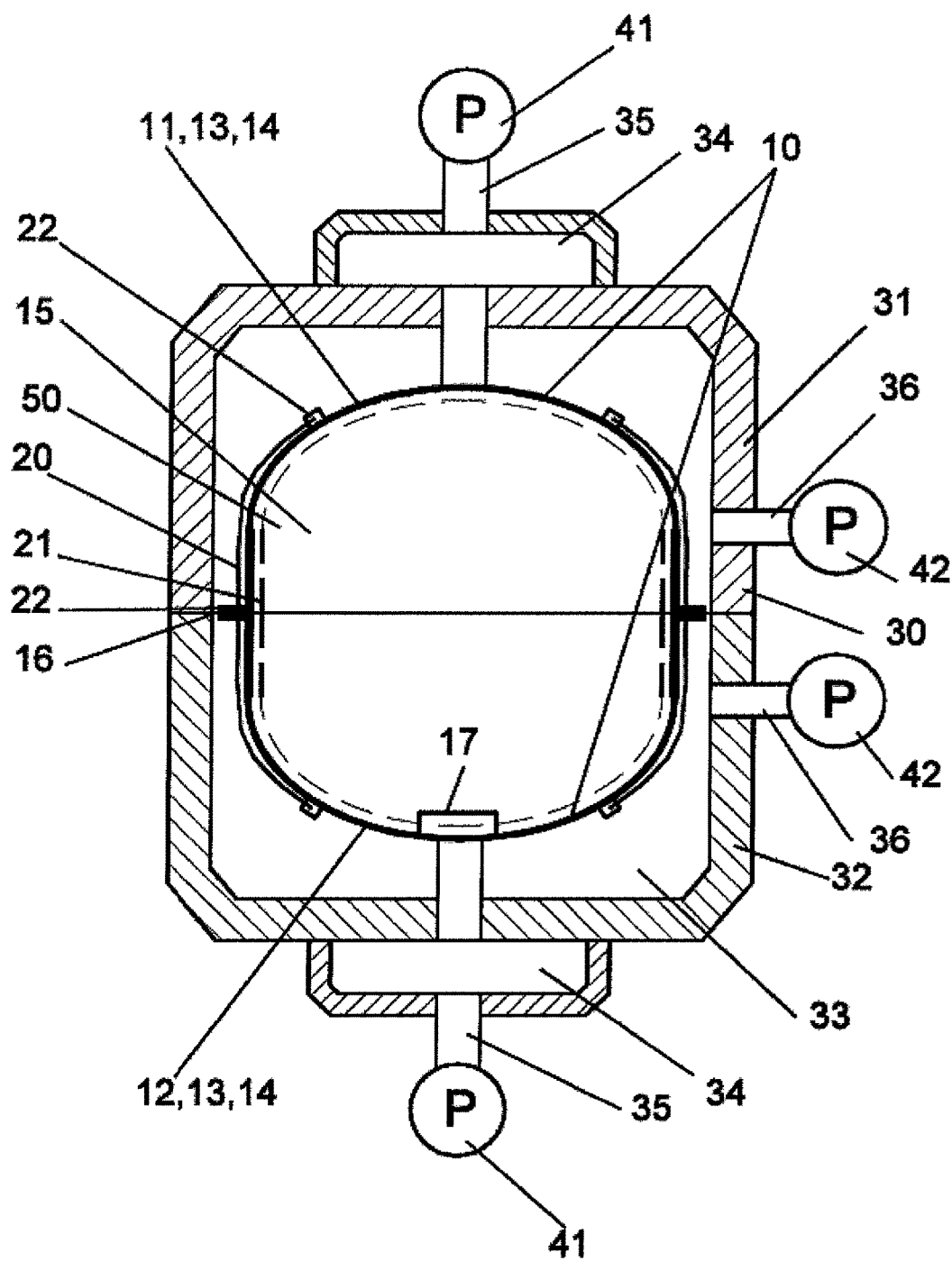
Figure 3:
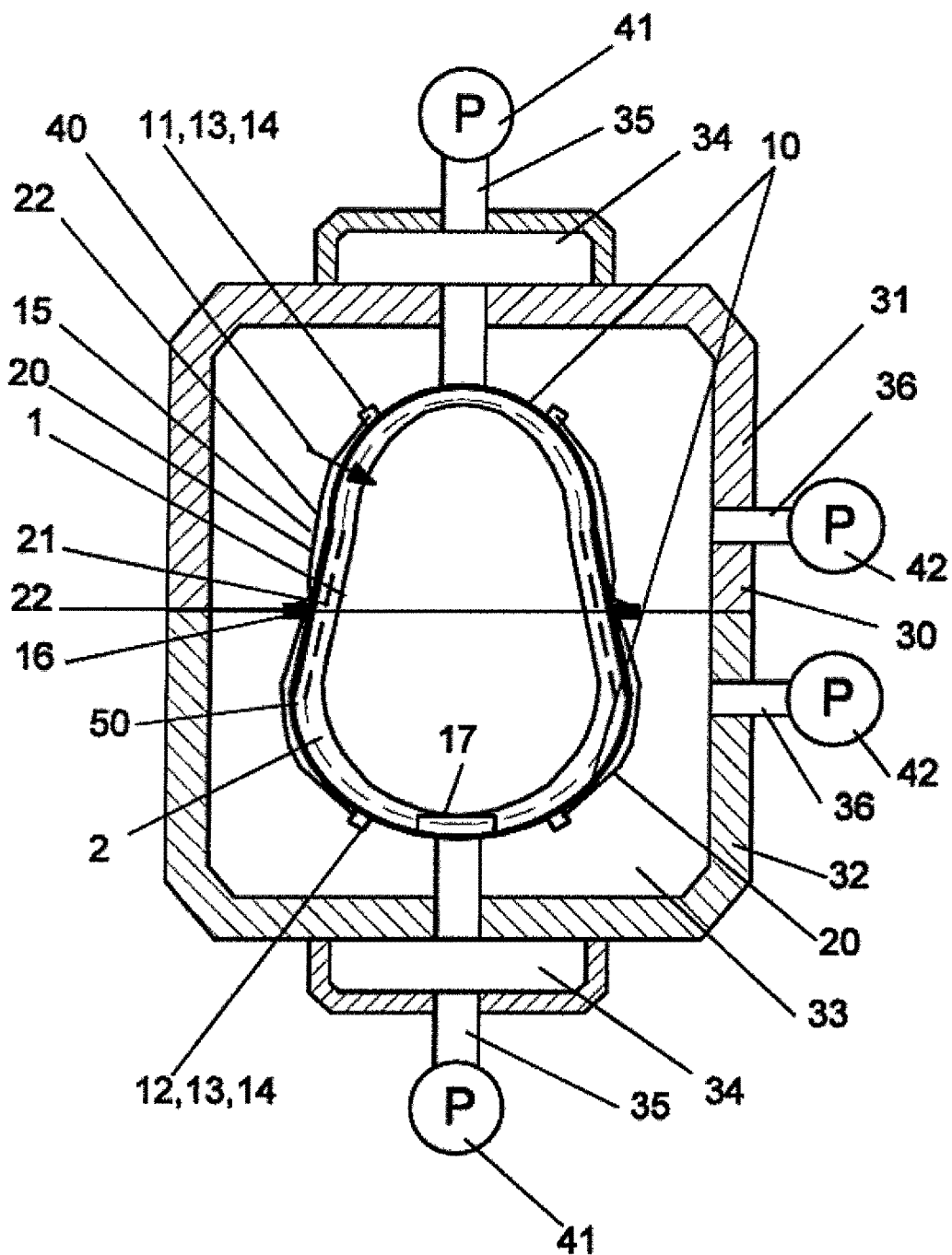

FIG. 1: shows a depiction of the device when open according to the invention, FIG. 2: shows a depiction of the device according to the invention when closed, FIG. 3: shows a depiction of the device according to the invention when closed while treating an object.

First, the design of the device according to the invention will be explained with reference to FIGS. 1 and 2.

The device according to the invention comprises a jacket apparatus 10; the upper, first jacket part 11 and a lower, second jacket part 12. The two jacket parts 11, 12 are designed as concavities so that they form a holding chamber 15 between themselves for accommodating an object (not shown in FIGS. 1 and 2). The wall 13 of each jacket part 11, 12 is designed relatively thin and, in the present exemplary embodiments, is made from a dielectric 14, at least in sections. The two jacket parts 11, 12 can be connected to each other by sealing elements 16. A first electrode 20 is arranged on the outside of each sleeve part 11, 12, for example as a curved metal strip, and a second electrode 21 is arranged on the inside. The first electrode 20 is fastened by means of fastening means 22 to the surface of the wall 13 of the respective jacket apparatus 11, 12. In the bottom region of the second jacket part 12, there is a spacing element 17 for supporting the object to be accommodated.

The jacket apparatus 10 is surrounded by a housing 30 that is formed from a top, first housing part 31 and a bottom, second housing part 32. The first housing part 31 surrounds the first jacket part 11, and the second housing part 32 surrounds the second jacket part 12. The housing part 30 forms a housing interior 33 between the inside of the housing parts 31, 32 and the outside of the jacket parts 11, 12. A conditioning chamber 34 is connected to the outside of each housing parts 31, 32. The holding chamber 15 is fluidically connected by means of a first fluidic connection 35 via the conditioning chamber 34 to an apparatus for generating a volumetric flow of gas 41. The housing interior 33 is fluidically connected by means of a second fluidic connection 36 to an apparatus for generating a pressure gradient 42. By means of the apparatus for generating a volumetric flow of gas 41, a process gas 50 can be supplied via the conditioning chamber 34 to the working chamber 15 as shown in FIG. 3, or respectively the toxic gases arising after plasma treatment can be removed from said working chamber 15. The conditioning chamber 34 serves to adjust the desired composition of the process gas mixture, or respectively the desired pressure. By means of the apparatus for generating a pressure gradient 42 that is preferably designed as a pump, a pressure can be generated in the housing interior 33 that is greater than the pressure in the working chamber 15.

FIG. 2 shows a depiction of the device according to the invention when closed, wherein it can be seen that the first jacket part 11 and the second jacket part 12 are connected by means of sealing elements such that the holding chamber 15 formed by the jacket parts 11, 12 is closed gas-tight. Furthermore, the first housing part 31 and the second housing part 32 are also connected gas-tight to each other.

FIG. 3 shows the mode of operation of the device according to the invention. By generating a pressure gradient 40 by setting a pressure in the housing interior 33 greater than the pressure in the holding chamber 15, the jacket apparatus 10 adapts to the shape and/or size of the object 1 accommodated in the holding chamber 15, which is depicted in this case in the shape of an egg. The second electrode 21 positioned in the interior of the jacket apparatus 10 is hence entrained by the movement of the jacket apparatus 10 and adapted to the surface of the object 1 to be treated. Since the first electrode 20 is fastened to the outer surface of the jacket apparatus 10, this first electrode 20 is also entrained by the jacket apparatus 10 when it moves. The fastening means 22 for fastening this first electrode 20 are spaced far enough from each other that the first electrode 20 does not have to undergo the same amount of change in shape as the jacket apparatus 10, although it is still positioned close enough to the second electrode 21 to be able to generate a plasma through the respective jacket part 11, 12 and thereby be able to treat the object 1.

This plasma 2 is preferably generated by dielectric barrier discharge between the first electrode 20 and second electrode 21, wherein the material of the jacket apparatus 10 forms the dielectric. The object 1 to be treated rests on the spacing element 17. By introducing a correspondingly strong volumetric flow of a process gas 50 by means of the apparatus for generating a volumetric flow of gas 41, the object 1 to be treated can be lifted slightly off the spacing element 17 so that the zone of the object 1 opposite the spacing element 17 can be treated with plasma.

Overall, it can be seen that by flexibly adapting the jacket apparatus 10 to the shape and/or size of the object 1 to be treated, the volume can be greatly reduced within the interior of the jacket apparatus to be filled with process gas so that correspondingly less pump performance is needed to fill the working chamber with a process gas 50, or respectively to draw the gas out of the working chamber. Furthermore, the position of the electrodes is flexibly adapted to the position of the area of the object 1 to be treated.

For an improved adaptation of the pressure conditions within the holding chamber between the object 1 to be treated and the jacket apparatus 10, the distance therebetween can be varied.

Since the electrodes 20, 21 are preferably not connected over their entire length to the material of the jacket apparatus 10, the electrodes also do not have to undergo the amount of change in shape experienced by the jacket apparatus 10 such that the electrodes 20, 21 are subject to less of a rising or alternating load, and a longer service life of the electrode and hence the entire apparatus is accordingly to be expected.

The device according to the invention can be connected in almost any manner to a plurality of equivalent devices to form a system according to the invention, wherein only the housing parts 31, 32 of the individual devices need to be mechanically connected to each other. In a preferred embodiment, the apparatuses for generating a volumetric flow of gas 21, or respectively the apparatuses for generating a pressure gradient 42, are also formed by individual systems jointly available to the devices.

REFERENCE NUMBER LIST

Object 1
Plasma 2
Jacket apparatus 10
First jacket part 11
Second jacket part 12
Wall 13
Dielectric 14
Holding chamber 15
Seal element (seal bead) 16
Spacing element 17
First electrode 20
Second electrode 21
Fastening means 22
Housing 30
First housing part 31
Second housing part 32
Housing interior 33
Conditioning chamber 34
First fluidic connection 35
Second fluidic connection 36
Pressure gradient 40
Apparatus for generating a volumetric flow of gas 41
Apparatus for generating a pressure gradient 42

The invention claimed is:

1. A device for treating an object (1) with plasma (2), comprising a jacket apparatus (10) which forms, or can form, a substantially gas-tight holding chamber (15) in which an object (1) to be treated can be accommodated, and a first electrode (20) as well as a second electrode (21), wherein the two electrodes (20, 21) are arranged with reference to the jacket apparatus (10) such that, when an electric difference in potential is applied to the electrodes (20, 21), a plasma (2) can be generated in the holding chamber (15) of the jacket apparatus (10), wherein
a wall (13) of the jacket apparatus (10) forming the holding chamber (15) of the jacket apparatus (10) has a modulus of elasticity of Ew<10 kN/mm$^2$, at least in sections, characterized in that the device comprises a housing (30), by means of which a housing interior (33) is formed, wherein the jacket apparatus (10) is arranged within the interior of the housing (33).

2. The device for treating an object with plasma according to claim 1, characterized in that the jacket apparatus (10) has a first jacket part (11) and a second jacket part (12), wherein the first jacket part (11) and the second jacket part (12) are connectable to each other gas-tight to form the gas-tight holding chamber (15).

3. The device for treating an object with plasma according to claim 1, characterized in that the housing (30) has a first housing part (31) and a second housing part (33), wherein the first housing part (31) is releasably connectable or connected to the second housing part (32) such that the housing interior (33) is designed gas-tight.

4. The device for treating an object with plasma according to claim 1, characterized in that the first electrode (20) and/or the second electrode (21) is/are fastened with respect to the jacket apparatus (10) by means of fastening means (22), wherein when an one of the first and second electrodes is fastened to the outer side of the jacket apparatus (10), the fastening means (22) of this electrode are arranged on the housing (30) and/or on a fluidic connection (35) running through the housing (30),
and/or
when an electrode is fastened to the inner side of the jacket apparatus (10), the fastening means (22) for this electrode are designed with a mechanical connection of a fluidic connection (35) running through the housing (30).

5. The device for treating an object with plasma according to claim 1, characterized in that the first electrode (20) and/or the second electrode (21) is designed in liquid form.

6. The device for treating an object with plasma according to claim 1, characterized in that the first electrode (20) and second electrode (21) are insulated by a dielectric (14) and configured to realize a dielectric barrier discharge to generate plasma.

7. The device for treating an object with plasma according to claim 1, characterized in that the jacket apparatus (10), in a closed state, basically has the shape of a sphere or ellipsoid, wherein the jacket apparatus (10) has a plurality of folds that create radial notches in the shape of the sphere, or respectively ellipsoid, wherein the respective directions of longitudinal extension of the notches are arranged substantially parallel to each other.

8. The device for treating an object with plasma according to claim 1, characterized in that the device has an apparatus for generating a volumetric flow of gas (41) into the holding chamber (15) and/or out of the holding chamber (15).

9. The device for treating an object with plasma according to claim 1, characterized in that the device has an apparatus for generating a pressure gradient (42) between the holding chamber (15) forming the jacket apparatus (10) and the surroundings of the jacket apparatus (10).

10. A system for treating a plurality of objects with plasma, comprising a plurality of devices for treating an object with plasma according to claim 2, wherein these devices are mechanically connected to each other such that movements of the respective first jacket part (11) and the second jacket part (12) can be performed by these devices to close and/or open the holding chambers (15) provided by the respective first jacket parts (11) and the respective second jacket parts (12).

11. A method for treating an object with plasma by means of a device according to claim 1, wherein the object (1) to be treated with plasma (2) is accommodated in the holding chamber (15) formed by the jacket apparatus (10), the holding chamber (15) is sealed substantially gas-tight, the shape and/or size of the holding chamber (15) is substantially adapted to the shape and/or size of the object (1) to be treated, and by applying an electrical difference in potential to the electrodes (20, 21), a plasma (2) is generated in the holding chamber (15) of the jacket apparatus (10) that acts on the object (1) to be treated.

12. The method for treating an object with plasma according to claim 11, characterized in that a pressure gradient is generated over the jacket apparatus (10) to adapt the shape and/or size of the holding chamber (15) to the shape and/or size of the object (1) to be treated so that, given the elasticity of the jacket device (10), the jacket apparatus (10) adapts at least sectionally to the shape and/or size of the object (1) to be treated.

13. The method for treating an object with plasma according to claim 11, characterized in that a process gas (50) is introduced into the holding chamber (15) before or at a same time as a plasma generation takes place.

14. The method for treating an object with plasma according to claim 11, characterized in that the method is performed by means of a system for treating a plurality of objects with plasma, comprising a plurality of devices for treating at an object with plasma, wherein the respective jacket apparatuses (10) have a first jacket part (11) and a second jacket part (12), wherein the first jacket part (11) and the second jacket part (12) are connectable to each other gas-tight to form the gas-tight holding chamber (15), and wherein these devices are mechanically connected to each other such that movements of the respective first jacket parts (11) and the second jacket part (12) can be performed by these devices to close and/or open the holding chambers (15) provided by the respective first jacket part (11) and the respective second jacket part (12), and wherein a plurality of objects (1) are treated simultaneously with plasma (2).

15. A method for treating an object with plasma by means of a system according to claim 10, wherein an object (1) to be treated with plasma (2) is accommodated in the respective holding chamber (15) formed by the jacket apparatus (441), the holding chamber (15) is sealed substantially gas-tight, the shape and/or size of the holding chamber (15) is substantially adapted to the shape and/or size of the object (1) to be treated, and by applying an electrical difference in potential to the electrodes (20, 21), a plasma (2) is generated in the holding chamber (15) of the jacket apparatus (10) that acts on the object (1) to be treated.

* * * * *